US005602788A

United States Patent [19]
Barry et al.

[11] Patent Number: 5,602,788
[45] Date of Patent: Feb. 11, 1997

[54] READ ONLY MEMORY HAVING LOCALIZED REFERENCE BIT LINES

[75] Inventors: Robert L. Barry, Essex Junction; John D. Chickanosky, South Burlington, both of Vt.

[73] Assignee: International Business Machines Corporation, Armonk, N.Y.

[21] Appl. No.: 660,264

[22] Filed: Jun. 7, 1996

[51] Int. Cl.⁶ .................................................. G11C 7/00
[52] U.S. Cl. ................. 365/210; 365/203; 365/230.03
[58] Field of Search .................... 365/210, 230.03, 365/203

[56] References Cited

U.S. PATENT DOCUMENTS

| | | | |
|---|---|---|---|
| 4,212,100 | 7/1980 | Paivinen et al. | 29/571 |
| 4,384,345 | 5/1983 | Mikome | 365/104 |
| 4,658,382 | 4/1987 | Tran et al. | 365/203 |
| 4,982,364 | 1/1991 | Iwahashi | 365/189.09 |
| 5,023,839 | 6/1991 | Suzuki et al. | 365/210 X |
| 5,040,148 | 8/1991 | Nakai et al. | 365/189.01 |
| 5,191,552 | 3/1993 | Nakai et al. | 365/189.01 |
| 5,197,028 | 3/1993 | Nakai et al. | 365/185 |
| 5,539,694 | 7/1996 | Rouy | 365/210 X |

OTHER PUBLICATIONS

IBM Data Book Doc. No. ADC05LDBU-01 pp. 902-903, Mar., 1995.

Primary Examiner—Son T. Dinh
Attorney, Agent, or Firm—Floyd E. Anderson

[57] ABSTRACT

A growable read only memory (ROM) provides improved performance over a wide range of array sizes by incorporating a localized reference bitline that accurately tracks changes in loading and variations in process parameters. The reference bitline is input into one side of a differential sense amplifier while a selected data bitline is input into the other side. The reference bitline is precharged and includes two columns, a first column includes devices that are matched to memory cell devices wherein a device of the selected word line will be selected to discharge the referenced bitline. The second column includes a recessed oxide device corresponding to each memory cell in the column. The combination of the two columns ensures that the reference bitline will discharge at a predetermined rate that tracks the rate at which a selected contact programmed memory cell discharges.

14 Claims, 7 Drawing Sheets

| FIG. 4A | FIG. 4B |

READ ONLY MEMORY HAVING LOCALIZED REFERENCE BIT LINES

FIELD OF THE INVENTION

The present invention relates generally to a read only memory (ROM) device, and more particularly, to a ROM device having an improved structure for optimized reference bit line timing.

BACKGROUND OF THE INVENTION

Integrated circuits continue to advance such that an increasing number of devices, and hence more circuit functions, are integrateable onto a single semiconductor device. Not only are the number of integrateable circuit functions increasing, but the complexity of the circuits are increasing as well. In addition to continual increases in density and complexity, engineers concurrently find ways to decrease design cycle times of these integrated circuits. One well known integrated circuit type that uses a design methodology that improves cycle times is the application specific integrated circuit (ASIC).

A substantial benefit of designing with ASICs is the ability, using sophisticated computer aided design (CAD) techniques, to quickly define a design using predefined or compiled library elements and realize that design in silicon. ASICs rely upon the use of predefined macros, for example, adders, multipliers, microprocessor cores, control functions, memories, etc. These macros can be predefined to the level of having all mask layers defined or may merely reside in software. Macros that reside in software are referred to as soft macros or paramaterized macros.

Soft or paramaterized macros describe a circuit or logic function that may be modified according to certain input parameters before being defined in the several mask layers. ROM circuits play an important role in systems and due to the needed flexibility of storing different amounts of memory in varying word lengths ROMs are often available as a soft or paramaterized macro. For example, a soft ROM macro (growable ROM) may be used in one system that requires 2K bits of memory organized in eight bit word lengths. The same growable ROM could very quickly be re-compiled to provide 4K words organized to provide sixteen bit word lengths.

High density ROMs typically rely upon a sensing scheme that operates upon a single bitline for each column of memory cells. Higher performance, however, generally dictates a sense amplifier design having dual inputs operating in a differential mode wherein the second input is a reference signal. During a read cycle the reference bitline must track an average transient response of a data bitline representing a logic one and the transient response of a data bitline representing a logic zero. Maintaining accurate reference bitline tracking in a growable ROM is complicated by the fact that the electrical characteristics of the data bitlines change not only in response to specific programming but also according to their location in the memory array. The change in such electrical characteristics is especially exacerbated in larger arrays.

The two data values in the memory array are programmed by either the presence or absence of a bitline contact to a drain of each memory cell transistor, wherein that transistor is an n-channel field effect transistor (NFET). When a contact is present, the corresponding selected bitline discharges during the read cycle. When a contact is not present, the corresponding selected bitline does not discharge but remains precharged. A design goal is to allow the reference bitline to discharge at half the rate the data bitline discharges (contact present). This has been accomplished heretofor by connecting two adjacent bitlines together and programming one of the two cells that share a same wordline. The dual cells present a doubled capacitive load causing the discharge rate of the reference bitline network halve.

When a contact is absent in a data bitline cell or the reference bitline cell the junction capacitances associated with the drain contact is not added to the corresponding data or reference bitline. Worst case capacitive loading occurs in a data bitline having a contact in each memory cell of that column. An accurate reference bitline to reflect this scenario would also have contacts in every cell. The inventors of the present invention described herein recognize that such a similarly programmed reference bitline would discharge double the current that is associated with the double capacitance and the target reference bitline discharge rate of half that of the data bitline discharge rate will not be achieved.

Accordingly it is desired to provide a ROM having localized reference bit lines that track a target discharge rate of one half the discharge rate of a data bitline regardless of the contact programming of the memory cells of the columns of memory cells.

SUMMARY OF THE INVENTION

An object of the present invention is to provide an improved read only memory (ROM) macro.

Another object of the present invention is to provide a ROM macro that is growable in a number of wordlines and data bitlines, including localized reference bitlines.

Still another object of the present invention is to provide a growable ROM macro wherein localized reference bitlines accurately track data bitlines regardless of the size of the ROM or the location of the reference bit lines and corresponding data bitlines.

According to an embodiment of the present invention, an integrated circuit includes a plurality of functional blocks interconnected to form a desired circuit function wherein at least one of the functional blocks is a read only memory (ROM). The ROM further includes a differential input sense amplifier having a plurality of data bitlines connected thereto. Each data bit line further includes a plurality of memory cells, such that each memory cell is selectable by a corresponding wordline of a plurality of wordlines. A plurality of column select devices couple the data bitlines to the sense amplifier, wherein each column select device corresponds to a data bitline of said plurality of data bitlines. A column decoder selects at least one column select device of the plurality of column select devices. A row decoder further selects one wordline of the plurality of wordlines. A reference bitline is associated with the plurality of data bitlines and is coupled to an input of said differential sense amplifier. The reference bitline includes a first column having a select device corresponding to each wordline, and further includes a second column having a recessed oxide device corresponding to each wordline such that when a memory cell of the plurality of memory cell is selected according to the selected column select device and the selected wordline, the reference bitline will discharge from a precharged voltage at a predetermined rate.

The foregoing and other objects, features, and advantages of the invention will be apparent from the following more particular description of a preferred embodiment of the invention, as illustrated in the accompanying drawing.

DETAILED DESCRIPTION

The design cycle for complex integrated circuits has been greatly improved by the use of macros that can be stored in a library such that a designer can call the macros from the library for integration into a design for performing the necessary function. Hence, the designer does not need to re-design commonly used circuits, even very complex commonly used circuits, for example, microprocessor cores, memories, digital signal processors etc. The cores are often designed as soft cores or compiled macros. These soft cores or compiled macros are designed around a base technology which base may be modified according to any number of parameters from which the design depends. For example, an adder circuit may add four, eight or many other addends depending upon a parameter which defines the number of inputs. This is known as parameterizing the macro. Another common example is a memory macro, for example, a read only memory (ROM) that can be parameterized according to a number of words, as well as the number of bits making up each word, wherein the bits are accessed in parallel therefrom.

Figure 1:
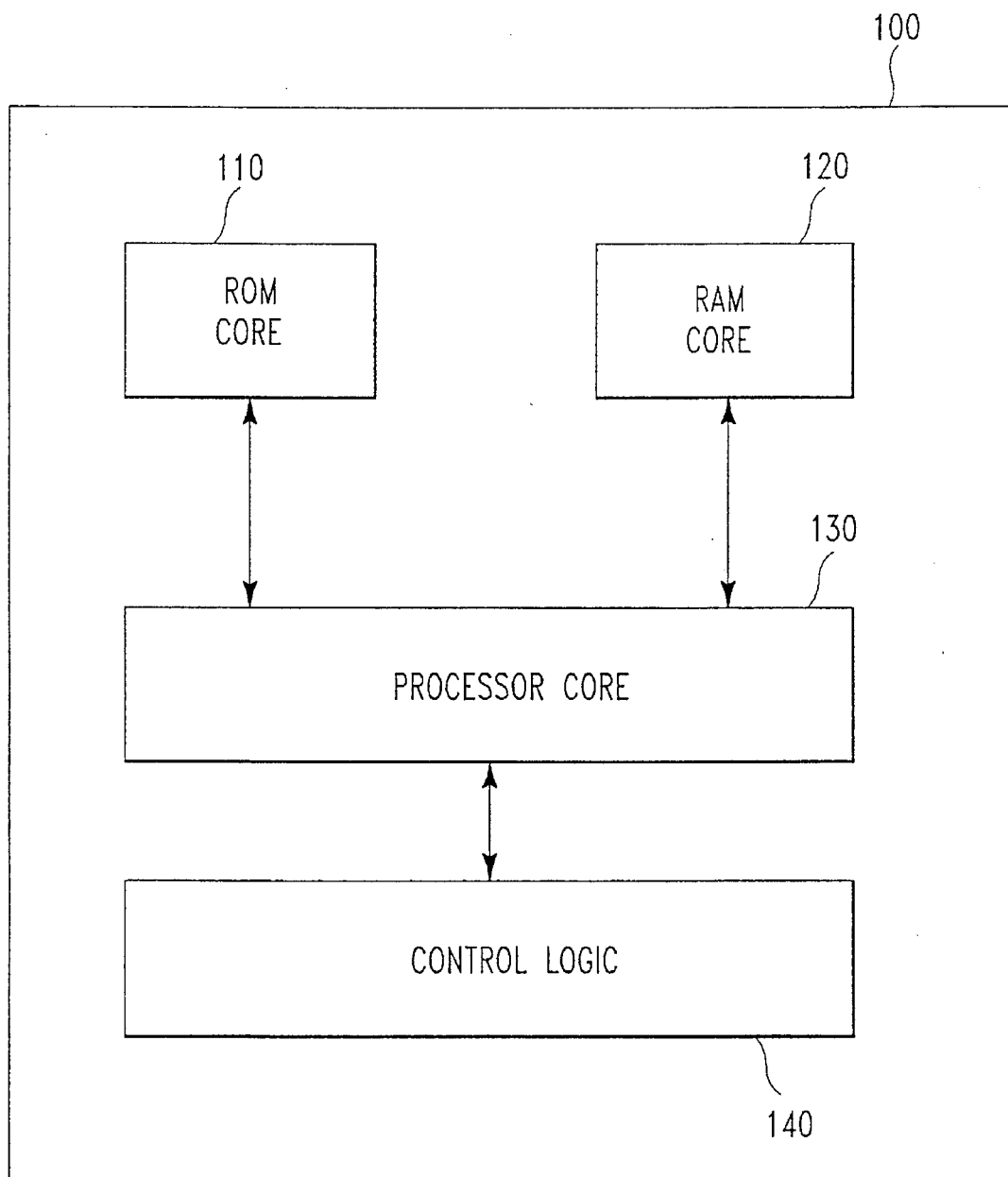
FIG. 1 is a high level floor plan diagram depicting a semiconductor integrated circuit having a number of functions implemented thereon, including a ROM macro.

FIG. 1 is a high level floor plan diagram depicting an integrated circuit 100 having a system realized from several different interconnected macros or logic functions. The integrated circuit 100 includes a ROM core 110, a random access memory (RAM) core 120, a processor core 130, and control or glue logic 140. Such memory, processor and logic functions are commonly available for the design of application specific integrated circuits (ASICs). As is well known in the art, a large number of different functions are available for incorporation into an ASIC design. Functions such as the ROM core 110 and RAM core 120 may be paramaterized or are growable such that the actual number of bytes determines the final form of the core 110 or 120 on the integrated circuit 100. One problem associated with growable functions such as ROM and RAM is that critical sensing and timing design parameters are adversely affected as the size of the functions increase which degrades performance or severely limits the size of the ROM or RAM.

Figure 2:
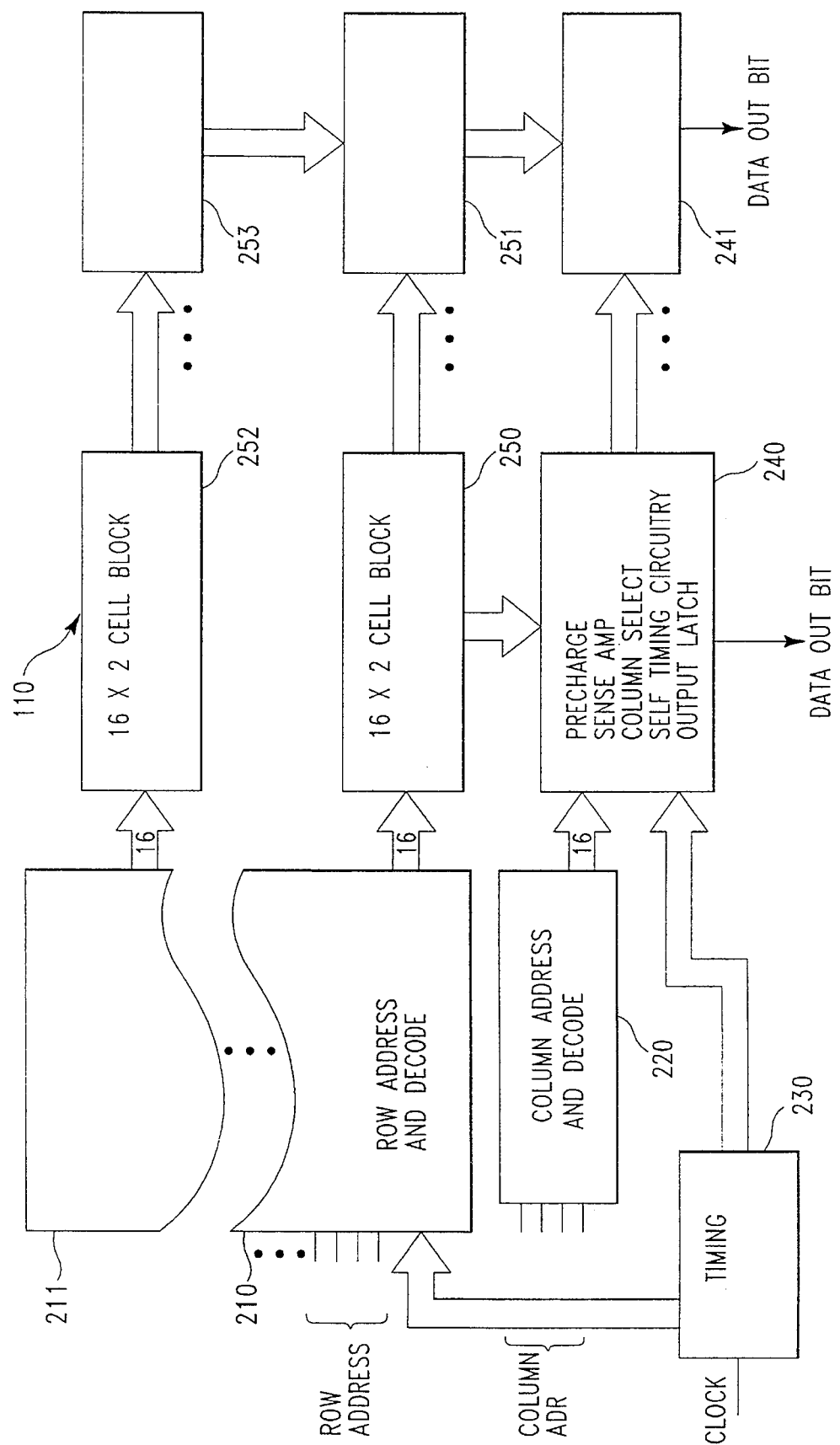
FIG. 2 is a block diagram showing greater detail of the ROM macro of FIG. 1 wherein the ROM macro is a growable memory.

FIG. 2 depicts the ROM core 110 in greater detail. The basic ROM core 110 includes a row address decoder 210, a column address decoder 220, a timing circuit 230, a sense amp and column select block 240, and cell block 250. The most basic building block is the cell block 250, which in the preferred embodiment is made up of a sixteen by two array of memory cells. The number of memory cells in the cell block 250 can vary according to design tradeoffs without departing from the invention described herein. The ROM core 110 is growable by increasing the number of cell blocks 250 in the horizontal direction (i.e., cell block 251) and the vertical direction (i.e., cell block 252). As the cell block 250 is expanded in the horizontal direction additional sense amp and column select blocks 240 must be added (i.e., sense amp and column select 241). Similarly, as the cell block 250 is expanded in the vertical direction row address decoders 210 are added (i.e., row address decoder 211).

The operation of a ROM device is well known to those skilled in the art and discussion herein is directed towards the preferred embodiment of the present invention. The sense amp and column select block 240 also contains precharge devices for actively pulling up data bit columns and further includes column select devices for selecting one of sixteen data bit columns. Additional circuit functions in the sense amp and column select block 240 include a self timing circuit and an output latch. The self timing circuit is referenced to a timing signal provided by the timing circuit 230 which is further keyed to a clock input. This timing signal synchronizes a row decode signal to the sense amp for improving sense amp accuracy and response time as is discussed below. The layout of the cell block 250 as well as the design and layout of the self timing circuitry are key to a ROM core that is growable while maintaining excellent operating characteristics over a wide variety of ROM core sizes.

Figure 3:
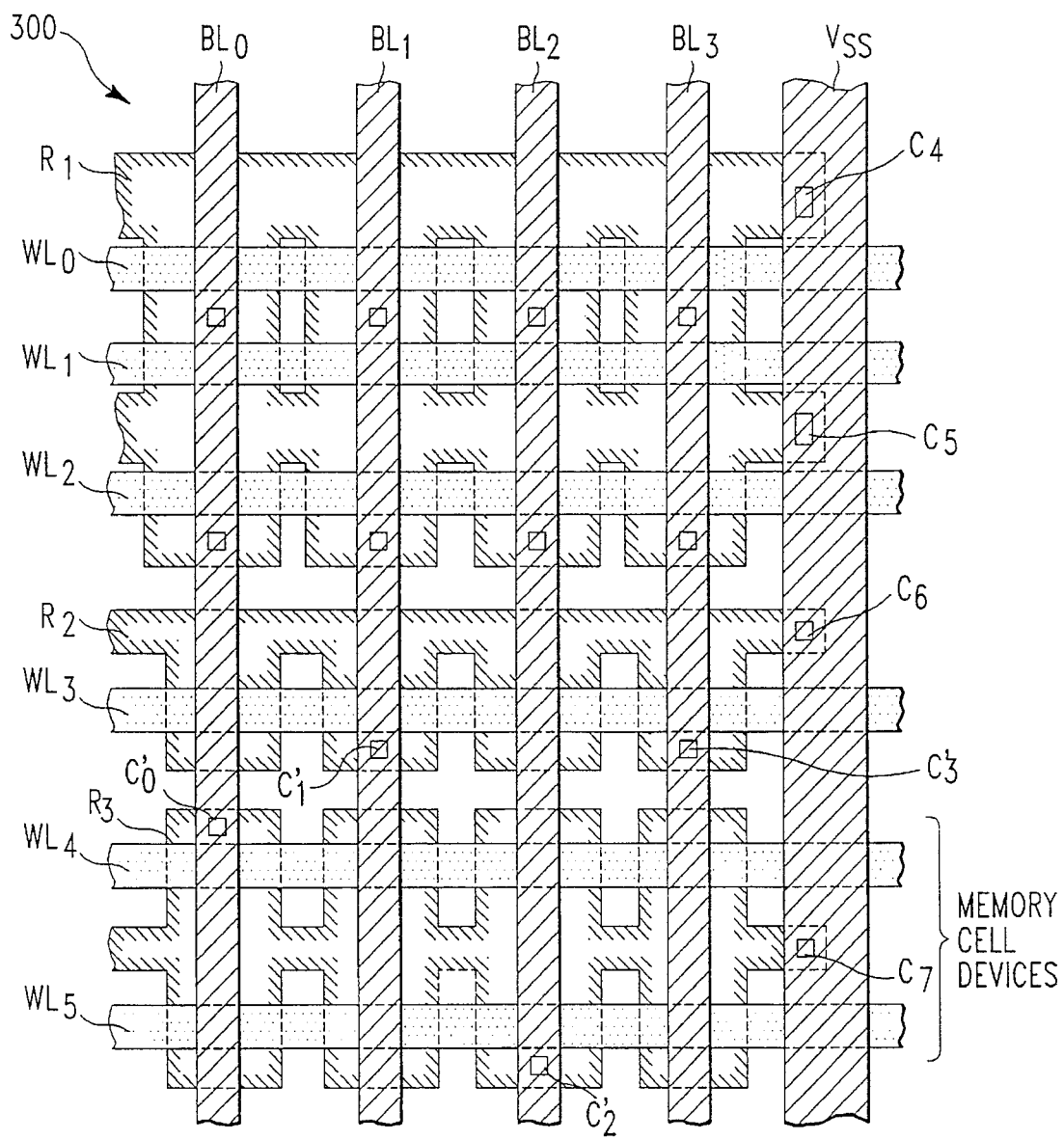
FIG. 3 is a plan view diagram showing several prior art ROM core cell layouts.

Referring now to FIG. 3, a prior art plan view of a portion of a ROM array 300 is shown. This particular array design is referred to as an "H" layout because the diffusions are "H" shaped and provides excellent density of memory cells wherein a memory cell is formed at each intersection of each wordline (WL0–WL5) and each bitline (BL0–BL3). The wordlines are constructed from polysilicon and the bitlines are fabricated in first level metal. The diffusion areas R1–R3 cooperate with the word lines to form the single transistor memory cells. The diffusion ends contact a ground voltage supply VSS by first level metal also. Factors that limit the performance, in terms of speed and accuracy, in the prior art memory array include the resistances of the word lines and the diffusions. As the array is grown in size, as would be required in a growable ROM macro, the performance limitations often adversely limit the size to which an array can be grown.

Figures 4, 4A:
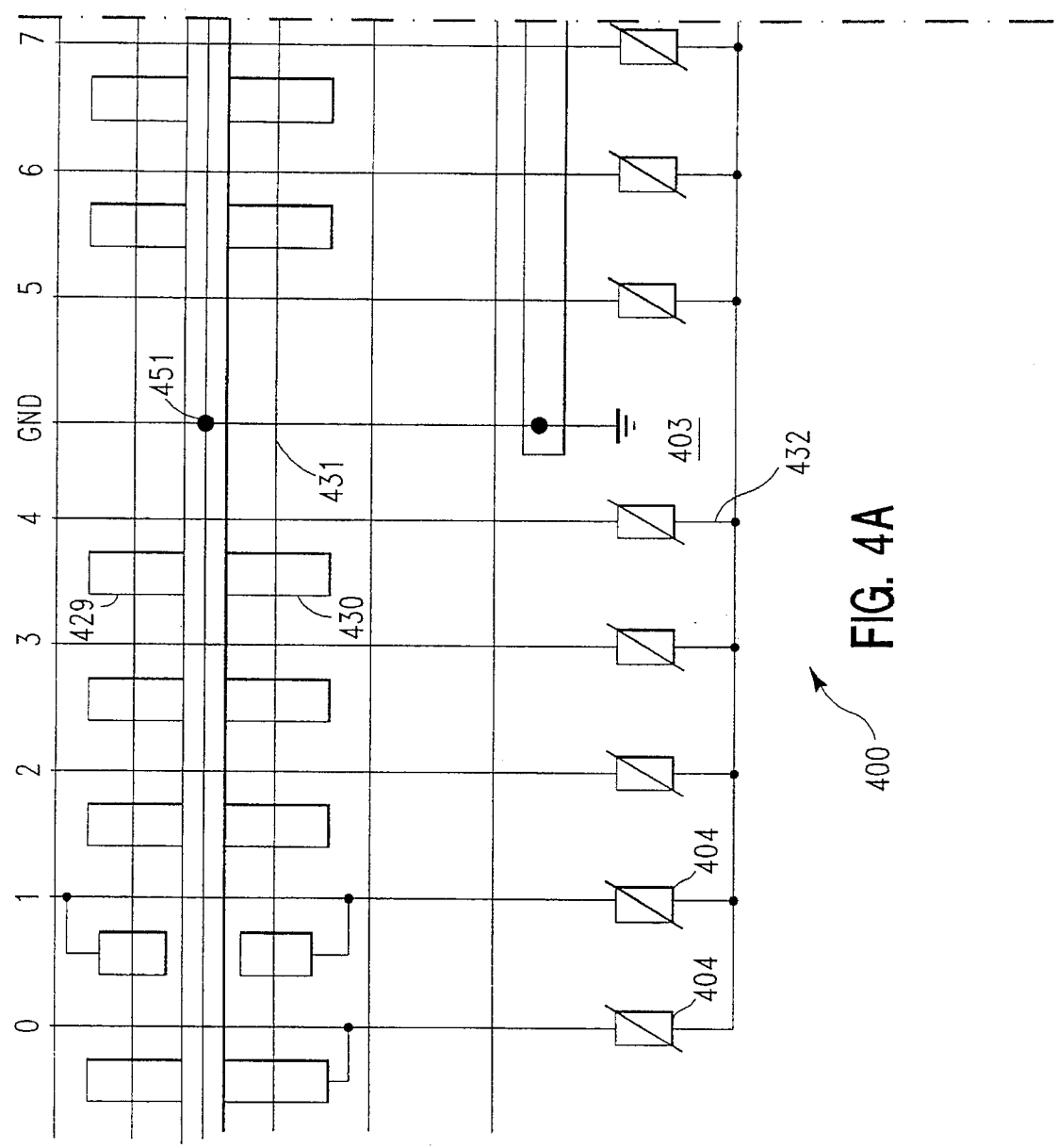
FIG. 4 is a plan view/schematic diagram showing the ROM device according to a preferred embodiment of the present invention.
Figure 4B:
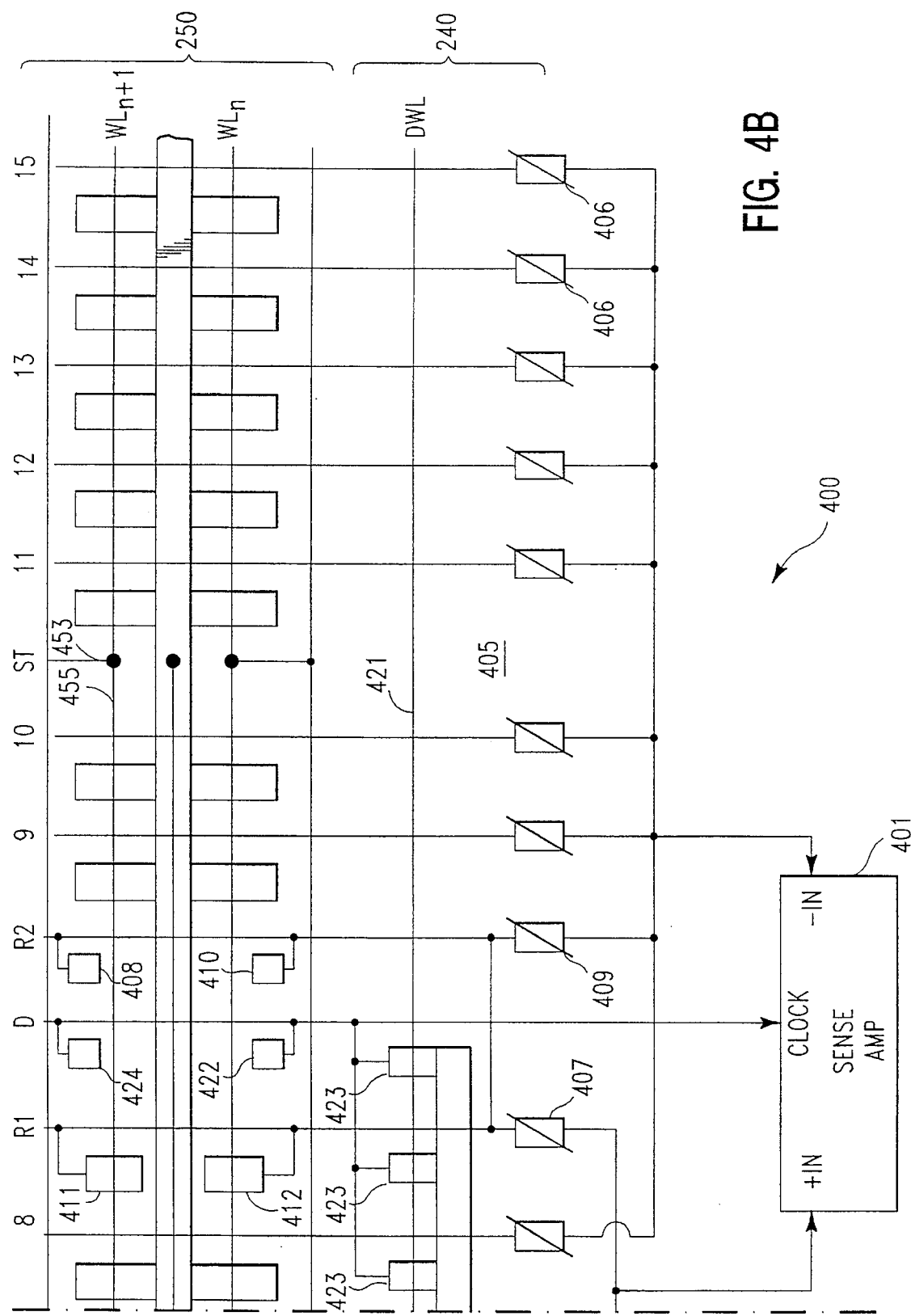

FIG. 4 depicts a combination of the sense amp and column select block 240 and the cell block 250 (see FIG. 2). In the sense amp and column select 240 a sense amplifier 401 provides differential sensing between a selected data bitline and a reference bitline that are input to either inverting or non-inverting inputs of the sense amplifier 401. In the particular embodiment shown, eight data bitlines 403 are provided for selection and are connected to the non-inverting input of the sense amplifier 401 and eight data bit lines 405 are provided for selection and are connected to the inverting input of the sense amplifier 401. The reference bitline is input into either the inverting or non-inverting input of the sense amplifier 401 depending upon which data bitline of data bitlines 403 or 405 is selected. A data bitline of the data bitlines 403 is selected by enabling one of the eight bit switches 404 and similarly a data bitline of the data bitlines 405 is selected by enabling one of the eight bit switches 406. Only a single data bitline will be enabled by the column address decoder 220 (see FIG. 2). The bit switches, in the preferred embodiment are realized from p-channel field effect transistors (PFETS).

The reference bitline includes devices 407 through 412. When a data bitline from the data bitlines 403 is selected, bit switch 409 will be concurrently selected. This causes a data bit line to be sensed at the non-inverting input and the reference bitlines to be sensed at the inverting input of the sense amplifier 401. Conversely, selecting a data bitline from the data bitlines 405 causes a bit switch 407 to be concurrently selected for the reference bitline and hence a switching of inputs to the sense amplifier 401. The purpose of the reference bitline is to provide a reference voltage level to the sense amplifier 401 that has a predetermined relationship to a voltage level of a stored data bit made available on a selected bitline. Preferably the reference bitline voltage level will be midway between a logic zero and a logic one data bit voltage level.

A data bit stored in the memory array is accessed by selecting a memory cell, for example, ROM bit transistor 430, which transistor intersects a selected word line (wordline 431) and a selected column (bit switch 432). The data bit stored at that location, a logic zero or a logic one, is determined by whether a contact is programmed at the drain of the ROM bit transistor for connecting the drain to a ground potential. The reference bitline, likewise has a like transistor at each row of the two rows of the cell block 250. Thus, when a wordline is selected by the row address decoder 220, wordline 431 in this example, a reference bitline select transistor 412 will also be selected causing the precharged reference bitline to begin discharging towards ground potential. The fall time of the reference bitline is an important design consideration for maximizing accuracy and speed in data access.

In the preferred embodiment of the present invention, the reference bitline is designed to discharge at a rate such that the reference bitline voltage is midway between a data bit voltage level that is discharging towards zero (drain contact present) and a full voltage level (drain contact absent) at a predetermined time. The predetermined time is set up by dummy wordline circuitry as will be described below. The time at which a bitline will begin to discharge and the rate at which a selected data bit will discharge, is affected by the size of the memory array and the memory cell's location in that memory array. Hence, for a growable ROM, the reference bitline's electrical characteristics needs to likewise change for optimum performance. The reference bitline as described herein will track the performance characteristics of the memory cell according to the location in the memory array, in part, because each reference bitline is localized within each column of cell blocks 250, 252. Factors affecting performance include the capacitance and resistance of the wordlines, bitlines, transistor diffusions, etc. Additionally, process parameter variations will affect performance, for example, variations in line widths and oxide thicknesses.

The reference bitline performance depends upon the capacitances associated with the reference bitline select transistors 411, 412, etc., and the recessed oxide devices 408, 410 etc. Hence, the reference bitline select transistors will track the contact programmed memory cell transistors in terms of discharge capability and capacitive loading wherein only one transistor is selected by an active wordline. The discharge rate of the reference bitline is made slower, however, by the additional recessed oxide defined diffusion devices 408, 410 etc (hereinafter simply referred to as recessed oxide devices). In the preferred embodiment, the capacitive loading on the reference bitline is substantially equal to twice the capacitive loading on a data bitline. The recessed oxide devices 408, 410 provide predictable capacitive loading since the defined diffusions thereof are essentially similar to the drain contacts of cell devices that the recessed oxide devices are designed to mimic. Furthermore, since a reference bitline is provided in each sense amp and column select block 240, performance characteristics of selected memory cells and associated reference bitlines are similarly affected by array position.

Figure 5:
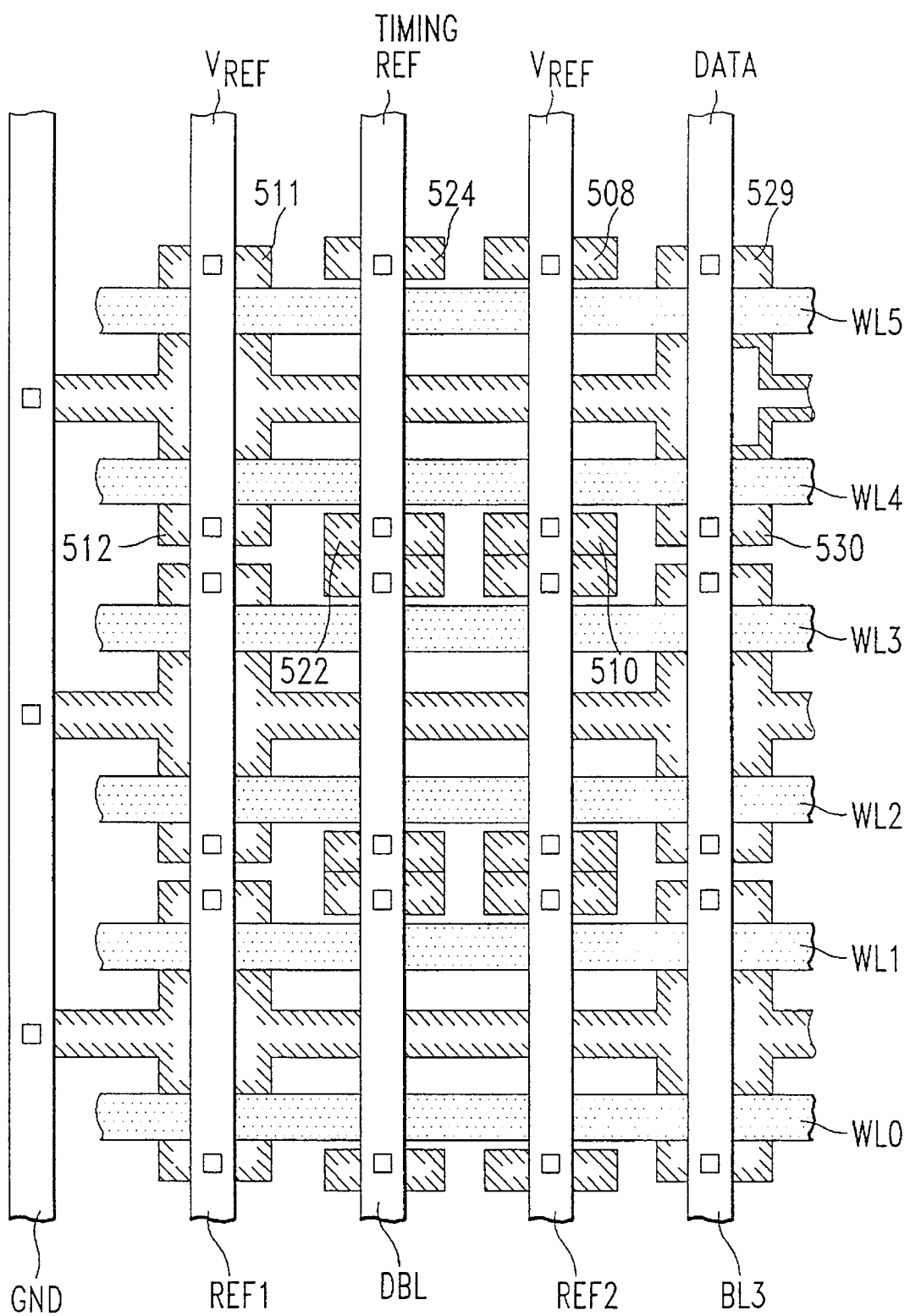
FIG. 5 is a layout diagram depicting a portion of the ROM device shown in FIG. 4 according to a preferred embodiment of the present invention.

Referring to FIG. 5, a plan view of a portion of the cell block 250 is shown. The reference bitline is shown having recessed oxide devices 508 and 510 in the right most column (Ref 2) of the reference bitline columns and the select transistors 511 and 512 in the left most column (Ref 1). The data bitline (Data) includes memory transistors 529 and 530 wherein memory transistor 530 and reference select transistor 512 are selected by wordline 531 (WL4). A portion of the timing reference line is also shown with recessed oxide devices 522 and 524. The plan view of FIG. 5 shows the repeatability of the cell block 250 which is amenable to a growable ROM device.

Figure 6:
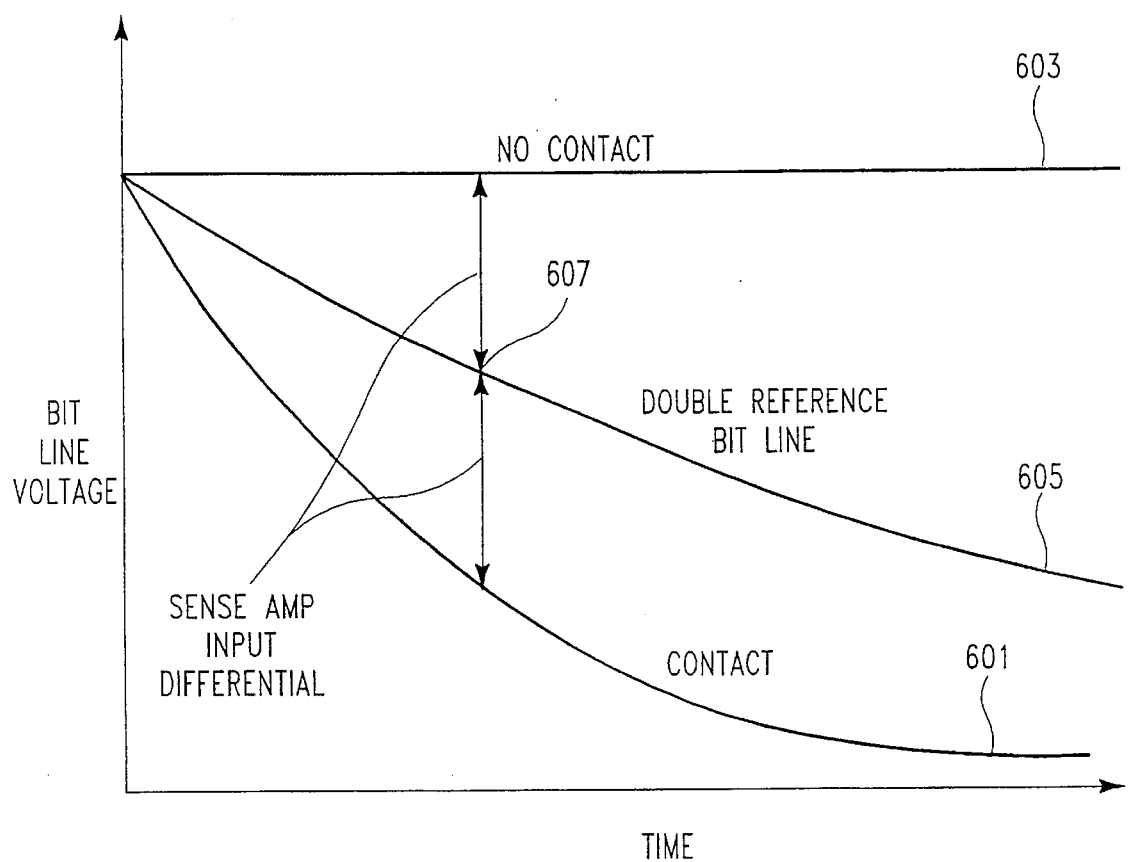
FIG. 6 is a waveform diagram showing the voltage and timing relationships between a reference bit line and programmed and non-programmed data bit lines.

FIG. 6 shows the relationship between time and the voltage levels for a selected data bitline having memory cells with a contact 601 and without a contact 603 and the selected reference bitline 605. The time at which the sense amp 401 is triggered to sample the voltages at the differential inputs is preferably at point 607 wherein the voltage differential between the reference bitline voltage and the data bitline voltage for both contact and non-contact programmed memory cells is maximized. Accurate timing is accomplished by the dummy wordline 421 that includes transistors 423 and recessed oxide devices 422 and 424.

The dummy wordline 421 is triggered at the same time that a desired wordline is selected by the timing circuit 230. The three parallel transistors 423 provide three times the discharge capability as a selected data bitline since essentially three times a memory cell transistor gate width is provided. The capacitance of a data bitline is substantially reproduced in the dummy bitline by the combination of capacitances associated with the three transistors 423 and the recessed oxide devices 422 and 424 etc. Therefore, when a wordline is selected, and hence the dummy wordline is concurrently selected, the rate at which the dummy bitline falls will be substantially three times the fall rate for a data bitline having a memory cell programmed with a drain contact. Different discharge rates may be desired and can be realized by modifying capacitive loading or transistor sizing of the transistors 423.

A reference bitline's electrical characteristics ability to track data bitline performance across the memory array is further optimized by reducing resistances in devices and wordlines. This is accomplished in part by strapping polysilicon word lines with second level metal 453. Additionally, memory transistor diffusions are strapped with a second level metal 455 as shown in FIG. 4. In the current design, a stacked contact/via 451 is used to connect diffusion to first level metal by contact and to connect first level metal to second level metal by a via.

A further advantage of the present invention is that accurate reference bitline tracking is maintained regardless of data programming. That is, diffusion areas that must be defined at the front end of the design process (initial mask layers) do not require modification based on data programming (memory cell drain contacts) performed later in the design process. This is possible due to the recessed oxide devices connected to the reference bitlines that do not have transistor gates and associated grounded source connections. Therefore, the ROM array is growable without losing accuracy due to reference bitline tracking characteristics. Also, the programing of the ROM array can be changed and only the later mask layers need be modified since reference bitline tracking is independent of contact programming.

While the invention has been particularly shown and described with reference to preferred embodiments thereof, it will be understood by those skilled in the art that various changes in form and details may be made therein without departing from the spirit and scope of the invention. For example, the selection of transistor types for bit switches may be PFET or NFET or otherwise varied depending upon process considerations; memory cell layout may likewise vary. Memory cell decoding and connectivity to sense amplifiers may change while still advantageously using the instant invention. While the invention provides substantial advantages to growable ROMs, fixed size ROMs also benefit from late personalization of data not adversely affecting reference bit line performance. Changes in future embodiments of the invention can therefore be made without departing from the teachings herein.

What is claimed is:

1. In an integrated circuit device, a plurality of functional blocks interconnected to form a desired circuit function, at least one of said functional blocks including a read only memory (ROM), said ROM comprising:
   a differential sense amplifier;
   a memory array including a plurality of data bitlines and a plurality of wordlines, and a plurality of memory cells, each memory cell selected by selecting a corresponding data bitline of said plurality of data bitlines and a corresponding wordline of said plurality of wordlines;
   a plurality of column select devices coupled to a first input of said differential sense amplifier, each column select device corresponding to a data bitline of said plurality of data bitlines;
   a column decoder for selecting at least one column select device of said plurality of column select devices;
   a row decoder for selecting a wordline of said plurality of wordlines; and
   a reference bitline associated with said plurality of data bitlines, said reference bitline coupled to a second input of said differential sense amplifier, said reference bitline including a first column having a select device corresponding to each wordline, and further including a second column having a recessed oxide device corresponding to each wordline such that when a memory cell of said plurality of memory cell is selected according to the selected column select device and the selected wordline, the reference bitline will discharge from a precharged voltage at a first discharge rate.

2. The integrated circuit device according to claim 1 further comprising a timing circuit for synchronizing the selection of a memory cell with a sampling point of said differential input sense amplifier.

3. The integrated circuit device according to claim 2 wherein each memory cell of said plurality of memory cells is contact programmable such that a selected contact programmed memory cell will discharge from a precharged voltage at a second discharge rate.

4. The integrated circuit device according to claim 3 further comprising a dummy wordline coupled for controlling said sampling point for triggering said differential input sense amplifier.

5. The integrated circuit device according to claim 4 wherein said dummy wordline is selected by said timing circuit concurrently with said selected corresponding wordline of said plurality of wordlines.

6. The integrated circuit device according to claim 3 wherein said first discharge rate is a rate substantially half the rate of said second discharge rate.

7. The integrated circuit device according to claim 6 wherein said dummy wordline discharges from a precharged voltage at a third discharge rate, said third discharge rate causing said sense amplifier to sample the reference bitline voltage and the data bitline voltage at a point where the reference bitline voltage is approximately midway between the precharge voltage and a voltage level of a selected contact programmed memory bit cell voltage.

8. A growable late personalized read only memory (ROM) having a capability to expand a number of memory cells, said ROM comprising:
   a plurality of differential sense amplifiers one differential sense amplifier for each bit position of an output data word;
   a plurality of memory cell blocks, one memory cell block corresponding to each differential sense amplifier, each memory cell block including a plurality of data bitlines having a plurality of selectable single transistor memory cells thereon, each single transistor memory cell programmable to store a data bit thereat by the addition or absence of a contact to the single transistor thereof;
   a column decoder coupled to said memory cell blocks for selecting a data bitline within each said memory cell block;
   a row decoder coupled to each memory cell block for selecting one wordline of a plurality of wordlines routed through said memory cell blocks; and
   a reference bitline in each memory cell block of said plurality of memory cell blocks coupled to one input of the corresponding differential sense amplifier, said reference bitline including first and second parallel columns, said first column including a plurality of select transistors of like performance with each single transistor memory cell, one select transistor corresponding to and selectable by each wordline, said second column including a recessed oxide device associated each wordline.

9. The growable late personalized ROM according to claim 8 wherein each said data bitline and each said reference bitline is precharged to a predetermined voltage level.

10. The growable late personalized ROM according to claim 9 wherein said reference bitline, when selected concurrently with a selected memory cell, discharges from said predetermined voltage level at a rate approximately one half the rate that the selected memory cell discharges if said selected memory cell is contact programmed.

11. The growable late personalized ROM according to claim 10 further comprising a dummy wordline controlling a dummy bitline precharged to the predetermined voltage level and coupled to a timing input of each said differential sense amplifier of said plurality of differential sense amplifiers.

12. The growable late personalized ROM according to claim 11 wherein said dummy wordline causes said dummy bitline to discharge from the predetermined precharge voltage level at another discharge rate, said another discharge rate causing said differential sense amplifier to sample the reference bitline voltage and the data bitline voltage at a point where the reference bitline voltage is approximately midway between the precharge voltage and a voltage level of a selected contact programmed memory bit cell voltage.

13. The growable late personalized ROM according to claim 12 wherein said another discharge rate is determined by at least one dummy wordline select transistor and a plurality of recessed oxide devices coupled to the timing input of said differential input sense amplifier.

14. A growable late personalized read only memory (ROM) having a capability to expand a number of memory cells, said ROM comprising:

a plurality of differential sense amplifiers one differential sense amplifier for each bit position of an output data word;

a plurality of memory cell blocks, one memory cell block corresponding to each differential input sense amplifier, each memory cell block including a plurality of data bitlines having a plurality of selectable single transistor memory cells thereon, each single transistor memory cell programmable to store a data bit thereat by the addition or absence of a contact to the single transistor thereof;

a column decoder coupled to said memory cell blocks for selecting a data bitline within each said memory cell block;

a row decoder coupled to each memory cell block for selecting one wordline of a plurality of wordlines routed through said memory cell blocks;

a reference bitline in each memory cell block of said plurality of memory cell blocks coupled to one input of the corresponding differential sense amplifier, said reference bitline including first and second parallel columns, said first column including a plurality of select transistors of like performance with each single transistor memory cell, one select transistor corresponding to and selectable by each wordline, said second column including a recessed oxide device associated each wordline; and a dummy wordline precharged to the predetermined voltage level and coupled to a timing input of each said differential sense amplifier of said plurality of differential sense amplifiers, said dummy wordline discharges from the predetermined precharge voltage level at a predetermined discharge rate, said predetermined discharge rate substantially faster than said a discharge rate of a data bitline for causing said differential sense amplifier to sample the reference bitline voltage and the data bitline voltage at a point where the reference bitline voltage is approximately midway between the precharge voltage level and a voltage level of a selected contact programmed memory bit cell voltage.

\* \* \* \* \*